United States Patent [19]

Sakata

[11] Patent Number: 4,811,018

[45] Date of Patent: Mar. 7, 1989

[54] ANALOG-TO-DIGITAL CONVERSION SYSTEM HAVING SIMULTANEOUSLY AUTO-ADJUSTED AMPLIFIER AND ATTENUATOR

[75] Inventor: Haruo Sakata, Tokyo, Japan

[73] Assignee: Clarion Co., Ltd., Tokyo, Japan

[21] Appl. No.: 12,574

[22] Filed: Feb. 9, 1987

[30] Foreign Application Priority Data

Feb. 13, 1986 [JP] Japan .................................. 61-29984

[51] Int. Cl.⁴ .............................................. H03M 1/18
[52] U.S. Cl. ..................................... 341/139; 341/126; 341/155
[58] Field of Search ..... 340/347 AD, 347 C, 347 CC, 340/347 NT, 347 M; 367/65–67; 381/29–32; 341/126, 131, 132, 139, 155, 156

[56] References Cited

U.S. PATENT DOCUMENTS

| | | | |
|---|---|---|---|
| 3,509,558 | 4/1970 | Cancro | 340/347 AD |
| 3,603,972 | 9/1971 | Vanderford | 340/347 AD |
| 3,879,724 | 4/1975 | McDonald | 340/347 AD |
| 3,919,657 | 11/1975 | Howlett et al. | 340/347 AD X |
| 3,972,626 | 8/1976 | Laskowsi | 356/226 |
| 4,739,307 | 4/1988 | Marcovici et al. | 340/347 SH X |

Primary Examiner—William M. Shoop, Jr.
Assistant Examiner—Brain K. Young
Attorney, Agent, or Firm—Flynn, Thiel, Boutell & Tanis

[57] ABSTRACT

An analog-to-digital conversion system for converting an analog signal to a digital signal for recording is configured to detect a low level period of the analog signal, amplify a low noise in the analog signal in the detected period by a predetermined multiplying ratio or by an amount corresponding to the signal amplitude, and subtract from the converted digital signal a number of bits corresponding to the amplification degree in the same period after analog-to-digital conversion, so as to reduce the influence of a noise entering in the analog signal before analog-to-digital conversion.

10 Claims, 5 Drawing Sheets

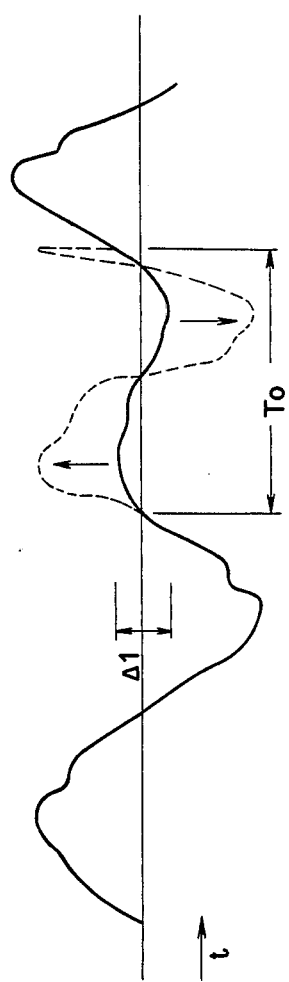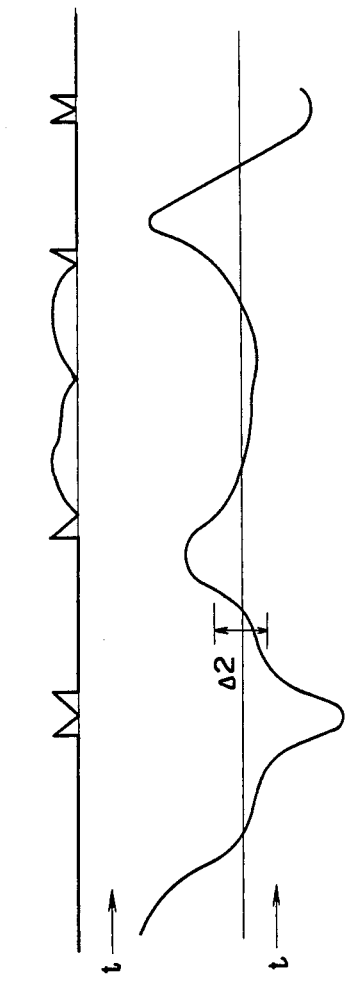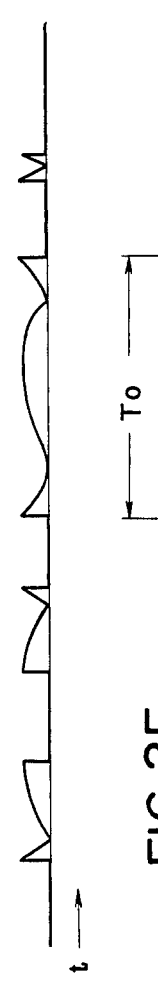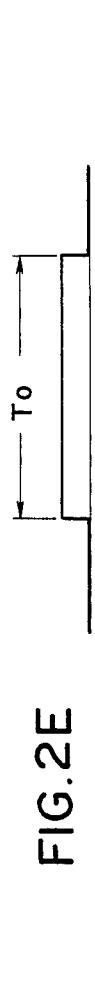
FIG. 2A
FIG. 2B
FIG. 2C
FIG. 2D
FIG. 2E

ANALOG-TO-DIGITAL CONVERSION SYSTEM HAVING SIMULTANEOUSLY AUTO-ADJUSTED AMPLIFIER AND ATTENUATOR

FIELD OF THE INVENTION

This invention relates to an analog-to-digital conversion system, and more particularly to an improvement thereof capable of reducing "influence of noises" which enter in an analog signal before its analog-to-digital conversion.

BACKGROUND OF THE INVENTION

In a case where a signal converted into a digital code is returned to an original analog signal (audio signal, for example), and the restored analog signal is further changed to a digital code and recorded on a recording medium (for example, a digital audio tape - hereinafter called "DAT"), the analog signal is often masked by "noises" of an amplifier, etc. when its signal level is low. Due to this, an analog-to-digital converter cannot maintain its original level resolution (16 bits in a DAT), and invites deterioration in the digitalized recording signal.

Generally speaking, if any noise enters in an analog signal, expected level resolution is not sufficiently effective in analog-to-digital conversion of the analog signal. In most cases, if a digitalized signal is converted to an analog signal, the converted analog signal itself includes less noise to establish high signal-to-noise ratio. However, noises often enter in the signal before subsequent digital recording.

The solid line curve in FIG. 5(a) shows an analog signal S. When it is converted to a digital signal, its bit levels represent the distribution shown by the solid line in FIG. 5(c). If a noise N shown in in FIG. 5(b) enters in the signal before analog-to-digital conversion, the analog signal takes a waveform $S_2$ shown by the dotted line in FIG. 5(a) which has a considerable difference from the solid line curve. The difference does not matter to human ears if the signal level is high. However, human ears hear it if the signal level is low.

The analog signal may be amplified by a low noise amplifier before analog-to-digital conversion so as to subsequently convert the amplified analog signal to a digital signal, eliminating low level bits of the digital signal. For example, when an input analog signal shown by the solid line of FIG. 4(a) is applied to an analog-to-digital converter, the signal level in a period T is low, and a difference in period T is sensed by human ears. Therefore, the signal is amplified as shown by the dotted line in FIG. 4(a) (doubled in the illustrated example). This increases the amplitude in period T, and hence reduces the influence of the noise. However, since this amplification extends to the entire length of the signal, the hatched region, for example, overlaps the non-linear region of the amplifier and invites clipping or distortion caused by saturation.

OBJECT OF THE INVENTION

It is therefore an object of the invention to provide an analog-to-digital conversion system capable of reducing the influence of noises at low levels (small amplitudes) of an analog signal to totally establish digital recording and reproduction of a high signal-to-noise ratio.

SUMMARY OF THE INVENTION

According to the invention, there is provided an analog-to-digital conversion device comprising:

a detection means for detecting a period of an input analog signal in which the amplitude of the analog signal does not exceed a predetermined value;

a gain control means responsive to a detection signal from said detection means to increase the gain of the input analog signal in said period;

an analog-to-digital conversion means responsive to an output from said gain control means in the form of analog signal to convert it to a digital signal; and a subtraction means for subtracting from said digital signal a number of bits corresponding to the gain in said period.

BRIEF DESCRIPTION OF THE DRAWINGS

FIGS. 2a to 2e are diagrams showing waveforms of signals at various points of the system of FIG. 1;

DETAILED DESCRIPTION

Figure 1:
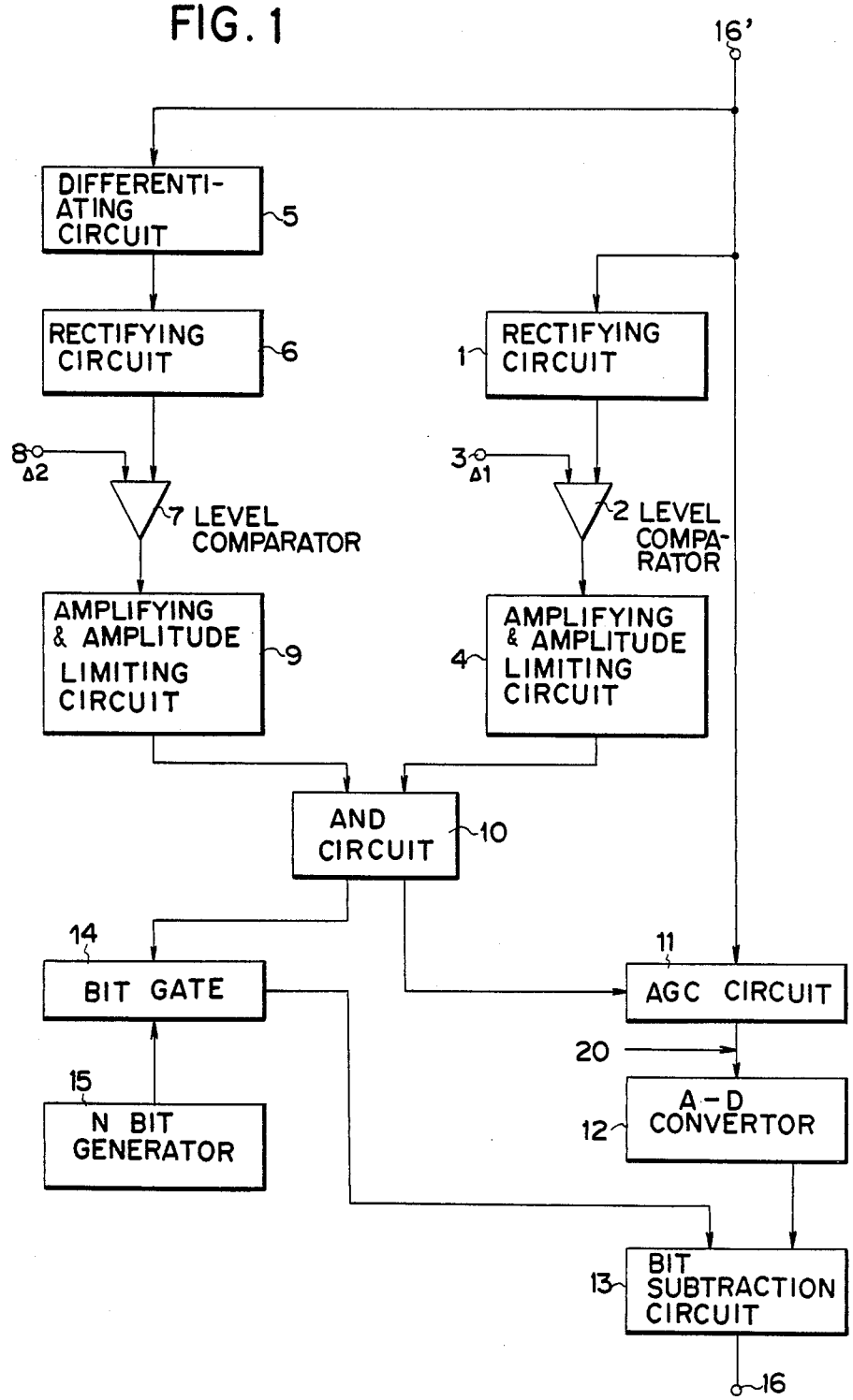
FIG. 1 is a block diagram of an analog-to-digital conversion system which is a first embodiment of the invention.

The invention is hereinbelow described in detail, referring to preferred embodiments illustrated in the drawings.

FIG. 1 is a block diagram of an analog-to-digital conversion system according to the invention configured to amplify an audio signal in a low level period by a given ratio. The conversion system includes rectifying circuits 1 and 6, comparators 2 and 7, reference voltage applying terminals 3 and 8, amplifying and amplitude-limiting circuits 4 and 9, differentiating circuit 5, AND circuit 10, gain control circuit 11, analog-to-digital (A/D) converter 12, bit subtracting circuit 13, bit gate 14, N bit generator 15, output terminal 16 and input terminal 16'. Assume here that an audio signal entering in the input terminal 16' has a waveform shown by the solid line in FIG. 2(a), and that the level in a period $T_0$ is lower than a given value $\Delta_1$. The amplitude in period $T_0$ is multiplied by n (corresponding to N bits). In this connection, the audio signal is rectified by the rectifying circuit 1 into uniform-polarity, i.e. forward d.c. voltage, and subsequently compared by the comparator 2 with the reference voltage $\Delta_1$ applied to the reference voltage input terminal 3, so that an output having a level lower than the reference voltage $\Delta_1$ is extracted to establish the waveform of FIG. 2(b). The output is amplified within a limited amplitude by the amplifying and amplitude-limiting circuit 4. On the other hand, the audio signal is differentiated by the differentiating circuit 5 to obtain a signal having the waveform of FIG. 2(c). The signal of FIG. 2(c) is rectified by the rectifying circuit 6. The resulting output d.c. voltage is compared to a reference voltage $\Delta_2$ applied to the reference voltage input terminal 8, and an output having a level lower than the reference voltage $\Delta_2$ is extracted to establish the waveform shown in FIG. 2(d). The signal of FIG. 2(d) is shaped by the amplifying and amplitude-limiting circuits 9. Outputs from the amplifying and amplitude-limiting circuits 4 and 9 are applied to the AND circuit 10 which in turn produces an output having the waveform shown in FIG. 2(e) which has a level lower than the reference voltage $\Delta_1$ and does not include large-sloping part of the input analog signal. The output of the AND circuit 10 is applied to the gain control circuit 11, which amplifies the input analog signal in period $T_0$ into the waveform shown by the dotted line in FIG. 2(a). A noise 20 enters in the output of the gain control circuit 11 before analog-to-digital conversion, and the signal including the noise 20 is converted to a digital signal by the analog-to-digital converter 12. In this configuration, however, the amplitude in period $T_0$ is n times the original amplitude as shown in FIG. 2(a), and the analog signal having the n-times amplitude is converted to a digital signal. Therefore, the N bit generator 15 generators N bits corresponding to the n-times amplitude component and applies them to the bit subtracting circuit 13 via the bit gate 14, so that the bit subtracting circuit 13 subtracts bits of period $T_0$ from the output of the analog-to-digital converter 12 (this corresponds to 1/n division of an analog signal).

Assuming that $n=2^N$, the subtraction corresponds to removal of the final (least significant N bits of an output of the analog-to-digital converter 12 and rightward displacement of the remainder bits to the end of the output. In this fashion, a digital signal corresponding to the solid line of FIG. 2(a) is obtained at the output terminal 16, and the signal-to-noise ratio (with respect to the noise 20) in the low level period $T_0$ is sufficiently increased.

Assuming that $n=4$ and $N=2$ in a six-bit analog-to-digital converter, the subtraction may be the following two-bit displacement.

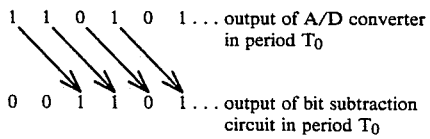

Therefore, what is requested to the N bit generator 15, bit subtraction circuit 13 and bit gate 14 is to merely shift the bits in period $T_0$. In this fashion, the influence of the noise in period $T_0$ is reduced to 1/n.

Figure 3:
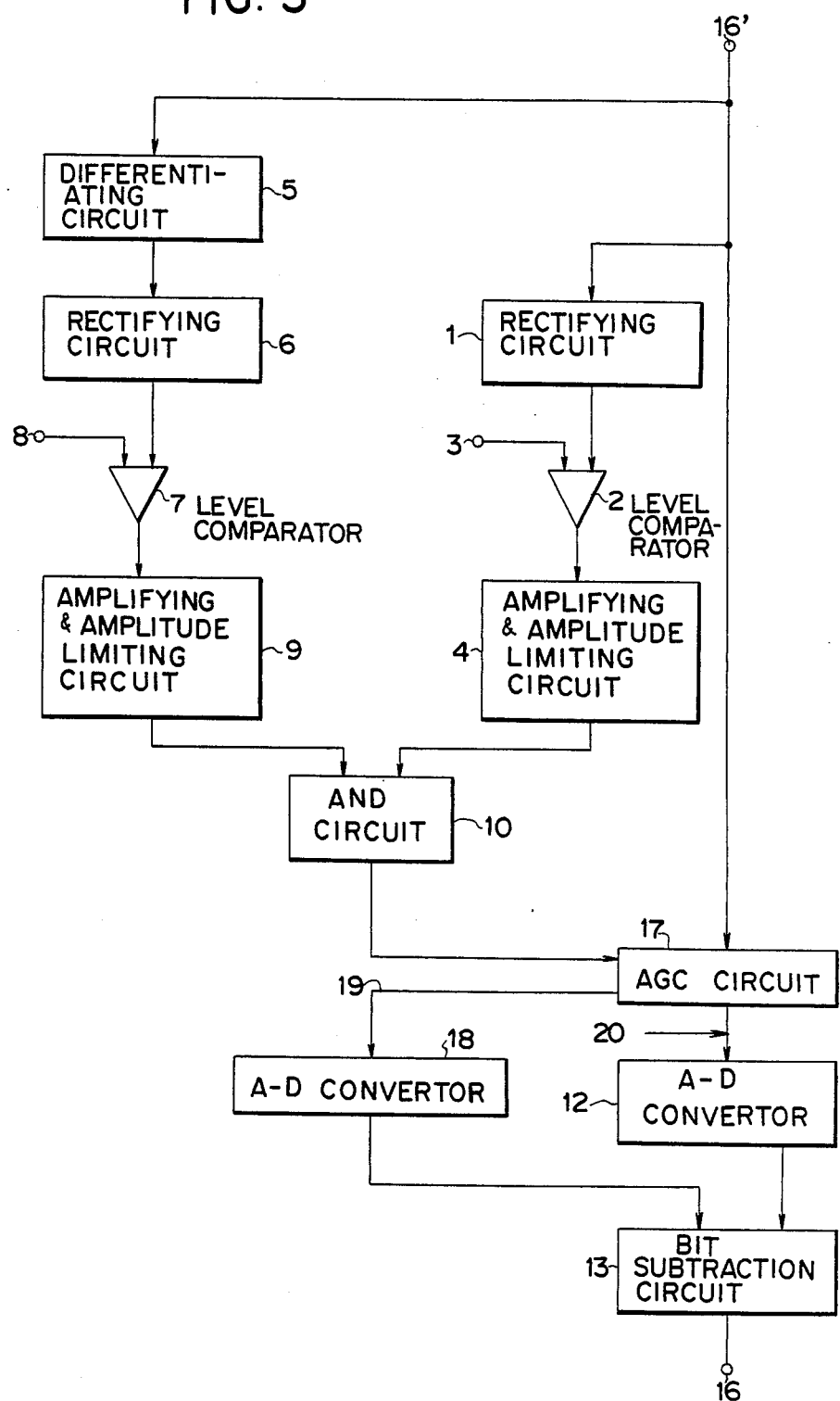
FIG. 3 is a block diagram of an analog-to-digital conversion system which is a second embodiment of the invention.
Figure 4A:
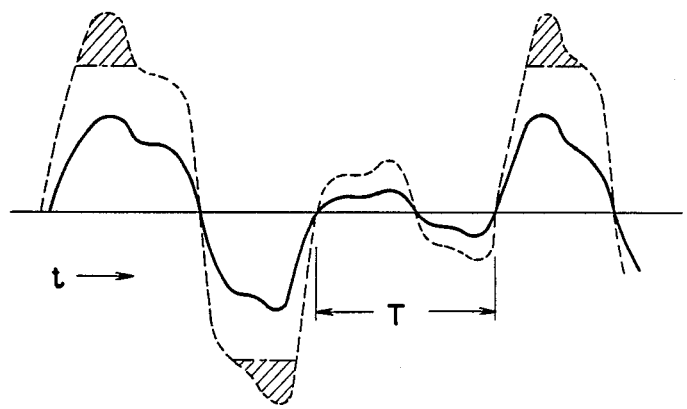
FIGS. 4a to 4c are diagrams showing waveforms of signals at various points of the system of FIG. 3.
Figure 4B:
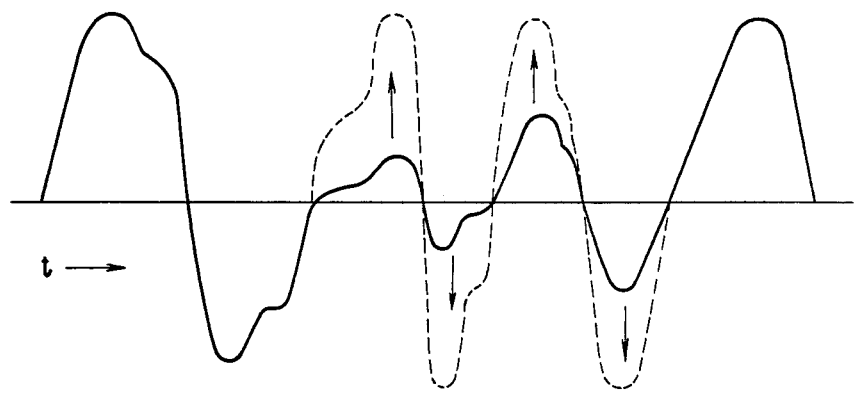
Figure 4C:
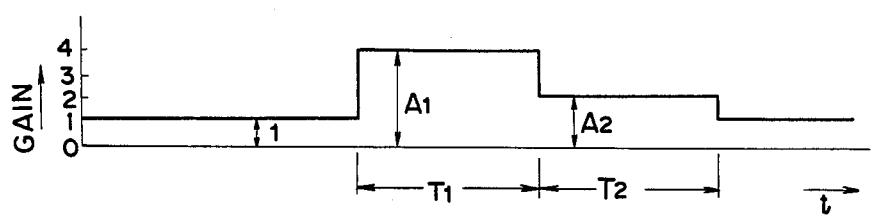
Figure 5A:
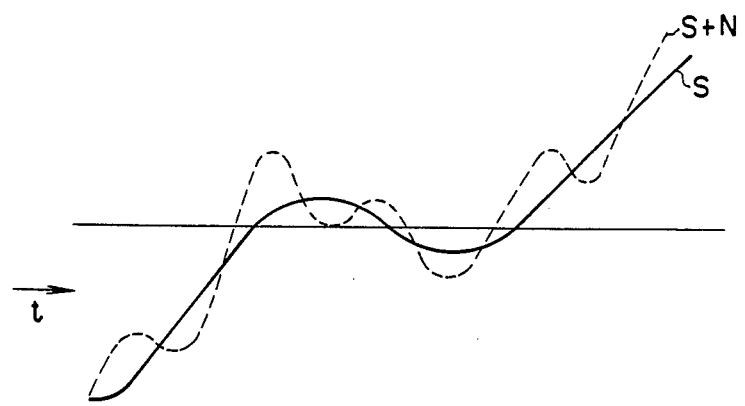
FIGS. 5a to 5c show waveforms for explanation of digitalization and entrance of noises.
Figure 5B:
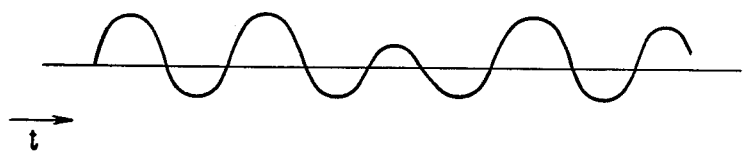
Figure 5C:
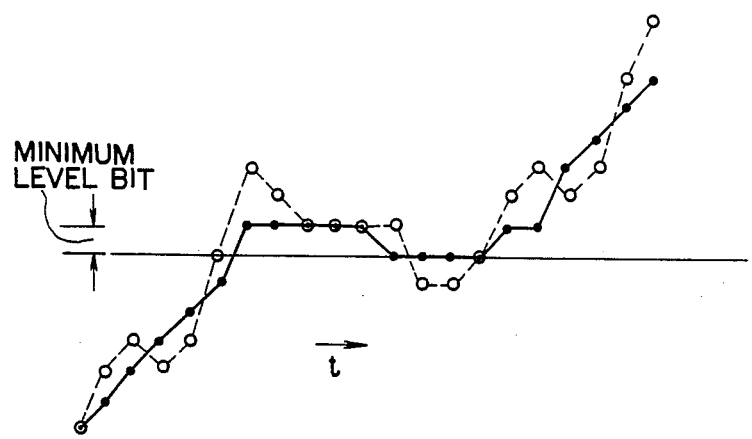

In order to advantageously use dynamic ranges of the transmission, it is preferable to effect a gain control shown in FIG. 4(c) against the input analog signal shown by the solid line in FIG. 4(b) and amplify the amplitude in the low level period shown by the solid line in figure 4(b) to establish a substantially uniform amplitude. More specifically, while the gain in the aforegoing embodiment is uniform in period $T_0$, the embodiment of FIG. 4 is configured to change the gain from gain $A_1$ in period $T_1$ to gain $A_2$ in period $T_2$. This gain control established less influence of the noise to input analog signal of FIG. 4(b) in period $T_1$ than that in period $T_2$. This method is called AGC system. FIG. 3 is a block diagram of a further embodiment of the invention employing the AGC system.

The device of FIG. 3 is substantially equal to that of FIG. 1 except that the gain control circuit 11 of FIG. 1 is replaced by an AGC (automatic gain control) circuit 17, so that the AGC circuit 17 is activated in periods $T_1$ and $T_2$ of the output of the AND circuit 10 shown in FIG. 4(c). An output 19 of the AGC circuit 17 includes gain control outputs $A_1$ and $A_2$ which are converted to bit outputs by an analog-digital converter 18 (for gain bit conversion). The bit subtraction circuit 13 subtracts the bits from the bit output of the converter 12 to reduce the number of bits of the digital signal by an amount corresponding to the amplitude increase in periods $T_1$ and $T_2$ of FIG. 4(b) to establish the solid line waveform of FIG. 4(b).

As described above, since the invention effects analog-to-digital conversion after amplifying a low noise in an analog signal in a low level period thereof, the influence of the noise entering in the signal before analog-to-digital conversion is significantly reduced. Beside this, since the analog signal is amplified only in a limited period and not along its entire length, the invention device never invites distortion caused by a non-linear characteristic in the amplification step upon signal amplification. Further, since the invention device amplifies a limited signal component in a low signal level period, an analog-to-digital converter of a predetermined number of bits suffices, and it does not require an analog-to-digital converter having a great level resolution which is indispensable when the analog signal is amplified throughout its entire length before analog-to-digital conversion.

What is claimed is:

1. An analog-to-digital conversion device, comprising:

detection means for detecting a period of time in which the amplitude of an analog input signal is less than a predetermined value and in which the slope of the analog input signal is less than a predetermined slope, and for producing a detection signal corresponding to said period of time;

a gain control arrangement having an input to which the analog input signal is applied, having means for producing an analog output signal by subjecting the amplitude of the analog input signal to a gain, and having means responsive to said detection signal from said detection means for increasing said gain of the analog input signal by a factor n during said period of time, where $n=2^N$ and N is an integer;

analog-to-digital conversion means responsive to the analog output signal from said gain control arrangement for periodically converting it into a digital binary number; and means for reducing each said digital binary number produced during said period by said factor n, by removing N least significant bits therefrom.

2. An analog-to-digital conversion device of claim 1, wherein said detection means includes a first level comparator circuit, a second level comparator circuit, and an AND circuit having two inputs, said irst and second level comparator circuits each having an input to which the analog input signal is applied and each having an output connected to a respective said input of said AND circuit, said AND circuit producing at an output thereof said detection signal for said gain control arrangement, said first level comparator circuit including a first rectifying circuit having an input to which said analog input signal is applied, a first level comparator having an input connected to an output of said first rectifying circuit and having a further input to which a first reference signal is applied, and a first amplifying and amplitude-limiting circuit having an input connected to an output of said first level comparator and having an output which is connected to one of said inputs of said AND circuit, and said second level comparator circuit including a differentiating circuit having an input to which said analog input signal is applied, a second rectifying circuit having an input connected to an output of said differentiating circuit, a second level comparator having an input connected to an output of said second rectifying circuit and having a further input to which a second reference signal is applied, and a second amplifying and amplitude-limiting circuit having an input connected to an output of said second level comparator and having an output which is connected to one of said inputs of said AND circuit.

3. An analog-to-digital conversion device of claim 2, wherein said means for reducing includes a bit generator which generates a bit output representing said number N, a bit gate and a bit subtraction circuit, said bit gate responding to said detection signal from said AND circuit by supplying said bit subtraction circuit with said bit output from said bit generator, and said bit subtraction circuit responding to said bit output by effecting said removal of the N least significant bits from each said binary number output by said analog-to-digital conversion means.

4. An analog-to-digital conversion device of claim 2, wherein said gain control arrangement includes means for outputting an analog gain signal representative of said gain, and wherein said means for reducing includes an analog-to-digital converter and a bit subtraction circuit, said analog-to-digital converter converting said gain signal from said gain control arrangement into a digital binary output and applying said binary output to said bit subtraction circuit, said bit subtraction circuit shifting each said binary number from said analog-to-digital conversion means by a number of bits defined by said binary output of said analog-to-digital converter in order to thereby remove from the binary number least significant bits equal in number to said binary output.

5. An analog-to-digital conversion device of claim 4, wherein said gain control arrangement includes means responsive to the amplitude of said analog input signal during said period of time for effecting automatic gain control of said analog input signal by setting said factor n to a value which is one of a set of values respectively corresponding to a plurality of different integer values of N.

6. An analog-to-digital conversion device of claim 5, wherein during said period of time said gain control means successively sets said factor n to two different said values from said set of values.

7. An analog-to-digital conversion device, comprising:

first detection means for detecting a first time period in which the amplitude of an analog input signal is less than a predetermined amplitude value and for producing a first detection signal in response to detection of each said first time period;

second detection means for detecting a second time period in which the slope of the analog input signal is less than a predetermined slope value and for producing a second detection signal in response to detection of each said second time period;

an AND circuit responsive to said first and second detection signals for producing a third detection signal during a third time period when said first detection signal is coincident with said second detection signal;

a gain control arrangement having an input to which the analog input signal is applied, having means for producing an analog output signal by subjecting the amplitude of the analog input signal to a gain, and having means responsive to said third detection signal from said AND circuit for increasing said gain of the analog input signal by a factor n during said third time period, where $n = 2^N$ and N is an integer;

analog-to-digital conversion means responsive to the analog output signal from said gain control arrangement for periodically converting it into a digital binary number; and reduction means for reducing each said digital binary number produced during said third time period by said factor n, by removing N least significant bits therefrom.

8. An analog-to-digital conversion device of claim 7, wherein said first detection means includes rectifying means for rectifying the analog input signal and first comparator means for comparing the level of an output signal of said rectifying means with the predetermined amplitude value, and wherein said second detection means includes differentiating means for differentiating the analog input signal and second comparator means for comparing the level of an output signal of said differentiating means with the predetermined slope value.

9. An analog-to-digital conversion device of claim 7, wherein said reduction means includes an N-bit generator for producing N bits, a bit gate to which the N bits and said third detection signal are applied, and bit subtraction circuit means responsive to said third detection signal for subtracting from each said digital binary number produced during said third time period the N bits provided by said bit gate.

10. An analog-to-digital conversion device of claim 7, wherein said gain control arrangement produces an analog gain control output representative of N, and wherein said reduction means includes an analog-to-digital converter which converts said gain control output from said gain control arrangement to N bits and includes bit subtraction circuit means for subtracting the N bits output by said analog-to-digital converter from each said digital binary number.

* * * * *

UNITED STATES PATENT AND TRADEMARK OFFICE
CERTIFICATE OF CORRECTION

PATENT NO. : 4 811 018

DATED : March 7, 1989

INVENTOR(S) : Haruo SAKATA

It is certified that error appears in the above-identified patent and that said Letters Patent is hereby corrected as shown below:

Column 4, line 54; change "irst" to ---first---.

Signed and Sealed this

Tenth Day of October, 1989

Attest:

DONALD J. QUIGG

Attesting Officer

Commissioner of Patents and Trademarks